United States Patent
Lee et al.

(10) Patent No.: US 9,059,804 B2
(45) Date of Patent: Jun. 16, 2015

(54) HIGH SPEED OPTICAL TRANSCEIVER MODULE

(71) Applicant: OE Solutions Co., Ltd., Gwangju (KR)

(72) Inventors: Sang Ho Lee, Gwangju (KR); Suk Han Yun, Seoul (KR); Tae Kyun Kim, Chungcheongnam-do (KR); Joo Ho Park, Gwangju (KR)

(73) Assignee: OE Solutions Co., Ltd. (KR)

( * ) Notice: Subject to any disclaimer, the term of this patent is extended or adjusted under 35 U.S.C. 154(b) by 143 days.

(21) Appl. No.: 13/691,731

(22) Filed: Nov. 30, 2012

(65) Prior Publication Data

US 2014/0037293 A1   Feb. 6, 2014

(30) Foreign Application Priority Data

Aug. 2, 2012   (KR) .................. 10-2012-0084785

(51) Int. Cl.
| | |
|---|---|
| G02B 6/36 | (2006.01) |
| H04B 10/40 | (2013.01) |
| H01S 5/022 | (2006.01) |
| H01S 5/024 | (2006.01) |
| G02B 6/42 | (2006.01) |

(52) U.S. Cl.
CPC .............. *H04B 10/40* (2013.01); *G02B 6/4286* (2013.01); *G02B 6/4266* (2013.01); *G02B 6/4246* (2013.01); *H01S 5/02212* (2013.01); *H01S 5/02453* (2013.01); *H01S 5/02469* (2013.01); *G02B 6/4263* (2013.01)

(58) Field of Classification Search
None
See application file for complete search history.

(56) References Cited

U.S. PATENT DOCUMENTS

| | | | | |
|---|---|---|---|---|
| 7,508,854 | B2 * | 3/2009 | Honda | 372/36 |
| 2005/0207459 | A1 * | 9/2005 | Yu et al. | 372/36 |
| 2005/0265410 | A1 * | 12/2005 | Cho | 372/36 |

* cited by examiner

*Primary Examiner* — Sung Pak
(74) *Attorney, Agent, or Firm* — Manatt, Phelps & Phillips; Robert D. Becker

(57) ABSTRACT

Disclosed herein is a high speed optical transceiver module, which makes it possible to prevent a wavelength shift and thus to achieve low power and high efficiency by forming a hole with a predetermined depth in a stem heat sink for dissipating heat generated in an LD through a lower portion of a stem and putting a micro heater in the hole, thereby compensating for the temperature of the LD in order to prevent wavelength shift caused by the influence of the ambient temperature on an LD chip in a transistor outline (TO) when an un-cooled optical transceiver module is driven at low temperature and to prevent the communication from being impossible when the ambient temperature is lowered during the communication using a CWDM scheme.

4 Claims, 5 Drawing Sheets

HIGH SPEED OPTICAL TRANSCEIVER MODULE

CROSS-REFERENCE TO RELATED APPLICATIONS

This application claims foreign priority to Korean Patent Application No. 10-2012-0084785, filed Aug. 2, 2012, the contents of which are incorporated by reference as if fully set forth herein.

FIELD OF THE INVENTION

The invention relates to optical transceivers, and more particularly to high speed optical transceiver modules.

BACKGROUND OF THE INVENTION

There is a problem with existing optical transceiver modules. When an un-cooled optical transceiver module is driven at low temperature, the ambient temperature influences a laser diode (LD) chip, and thus the wavelength of light generated in the LD chip is shifted. That is, when the ambient temperature is lowered during communication using a coarse wavelength division multiplexing (CWDM) scheme, there is a problem in that communication is not possible.

An auxiliary heater is used to maintain properties of the LD chip even at a lower temperature in an existing structure. In this case, the auxiliary heater is positioned between a radio frequency (RF) transmission line and a printed circuit board (PCB) connection portion. There is a problem in that the position of the auxiliary heater limits the length of the RF transmission line when the optical transceiver module is driven at a high frequency.

SUMMARY OF THE INVENTION

Preferred embodiments of the invention relate to a high speed optical transceiver module in which, when communication using a coarse wavelength division multiplexing (CWDM) scheme is implemented, all of pin leads of a laser diode (LD) are electrically isolated from a stem and a stem heat sink, thereby making it possible to prevent interference between channels in a low temperature environment and to facilitate transmission.

An object of preferred embodiments of the invention is to provide a high speed optical transceiver module in which a micro heater is employed when communication using a CWDM scheme is implemented, so that it is possible to prevent interference between channels in a low temperature environment and to facilitate transmission.

Another object of preferred embodiments of the invention is to provide a high speed optical transceiver module in which all of pin leads enclosed by glass or an insulator are electrically isolated from a stem and a stem heat sink, thereby reducing electrical noise.

A further object of preferred embodiments of the invention is to provide a high speed optical transceiver module in which wavelength shift can be prevented to thereby achieve low power and high efficiency by putting a micro heater in a hole formed in a stem heat sink through a lower portion of a stem to compensate for the temperature of an LD chip.

A still further object of preferred embodiments of the invention is to provide a high speed optical transceiver module, in which since a portion of the stem heat sink is empty, the cross sectional area of the stem is increased and thus heat conduction efficiency is improved, so that if the temperature of the LD chip increases, heat can be easily dissipated without putting an additional micro heater in the stem heat sink, thereby improving the light emitting efficiency and durability of the LD chip.

A still further object of preferred embodiments of the invention is to provide a high speed optical transceiver module, in which an RF transmission line can be decreased in length as compared with a case where an existing auxiliary heater is used, thereby making it possible to reduce the limitation of the length of the RF transmission line when the optical transceiver module is driven at high frequency.

In accordance with one aspect, preferred embodiments of the invention provide a high speed optical transceiver module, which makes it possible to prevent a wavelength shift and thus to achieve low power and high efficiency by forming a hole with a predetermined depth in a stem heat sink for dissipating heat generated in an LD through a lower portion of a stem and putting a micro heater in the hole, thereby compensating for the temperature of the LD chip in order to prevent wavelength shift caused by the influence of the ambient temperature on the LD chip in a transistor outline (TO) when an un-cooled optical transceiver module is driven at low temperature and to prevent the communication from being impossible when the ambient temperature is lowered during communication using a CWDM scheme.

In accordance with another aspect, preferred embodiments of the invention provide a high speed optical transceiver module, which is configured to easily dissipate heat when the temperature of an LD chip increases since the cross sectional area of the stem for dissipating heat generated in the LD chip is increased and thus heat dissipation is efficiently achieved to improve heat conduction efficiency by forming a hole with a predetermined depth in a stem heat sink through a lower portion of a stem.

In accordance with a further aspect, preferred embodiments of the invention provide a high speed optical transceiver module in which all of pin leads enclosed by glass or an insulator are electrically isolated from a stem and a heat sink, thereby reducing electrical noise in a system.

In accordance with a still another aspect, preferred embodiments of the invention provide a high speed optical transceiver module, in which the RF transmission line is decreased in length as compared with an existing long RF transmission line using an auxiliary heater, thereby processing data at a high frequency.

DETAILED DESCRIPTION OF THE PREFERRED EMBODIMENTS

Exemplary embodiments of the present invention will be described in detail with reference to the accompanying drawings.

In a high speed optical transceiver module according to the present invention, it is possible to prevent wavelength shift and thus to achieve low power and high efficiency by forming a hole with a predetermined depth in a stem heat sink for dissipating heat generated in an LD through a lower portion of a stem and putting a micro heater in the hole, thereby compensating for the temperature of the LD chip.

Since a conventional high speed optical transceiver module is influenced by ambient temperature, an LD chip in a TO is influenced by heat, and therefore, wavelength shift occurs.

That is, in order to prevent communication using a CWDM scheme from being impossible when the ambient temperature is lowered due to a wavelength shift phenomenon occurring during communication, an auxiliary heater is mounted between an RF transmission line and a PCB connection portion. However, the auxiliary heater uses high power and occupies a large mounting space.

Preferred embodiments of the invention are configured so that all of pin leads enclosed by glass or an insulator are electrically isolated from the stem and the stem heat sink, thereby reducing electrical noise in a system. Hereinafter, a specific embodiment of the present invention will be described.

Figure 1:
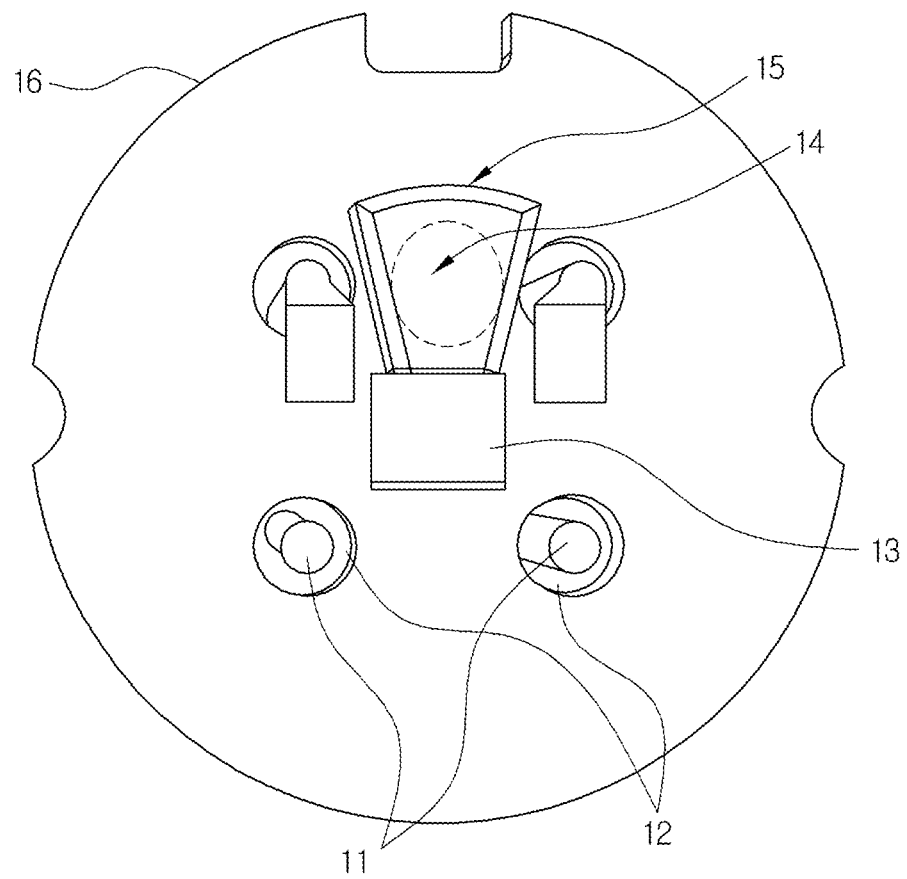
FIG. 1 is a plan view of a high speed optical transceiver module according to preferred embodiments of the invention.

A specific embodiment of the present invention will be described with reference to the accompanying drawings. Like components are denoted by like reference numerals throughout the accompanying drawings. FIG. 1 is a plan view of a high speed optical transceiver module according to some embodiments of the invention.

Figure 2:
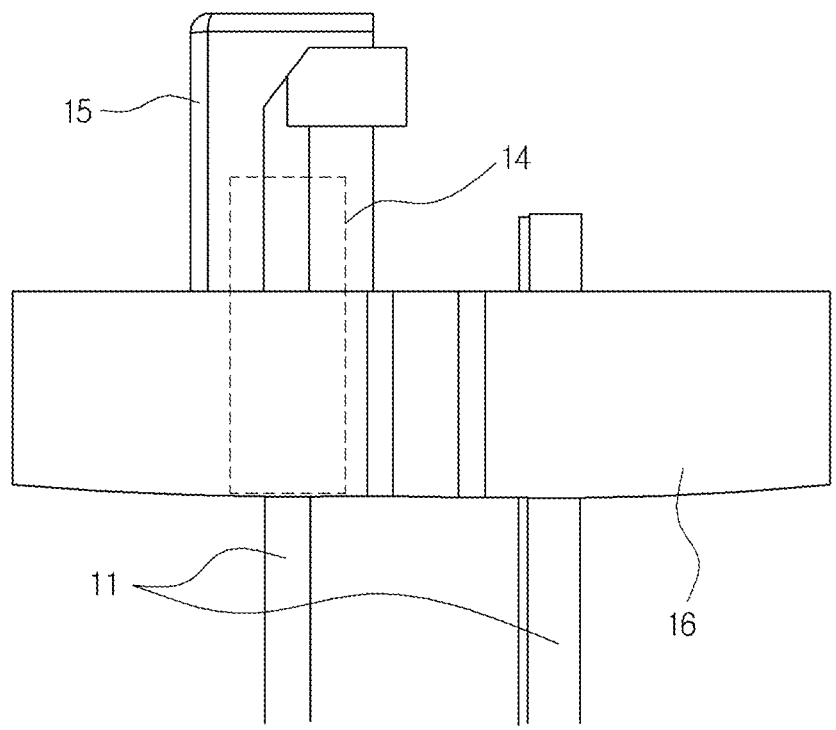
FIG. 2 is a side view of the high speed optical transceiver module according to preferred embodiments of the invention.

FIG. 2 is a side view of the high speed optical transceiver module according to some embodiments of the invention.

Figure 3:
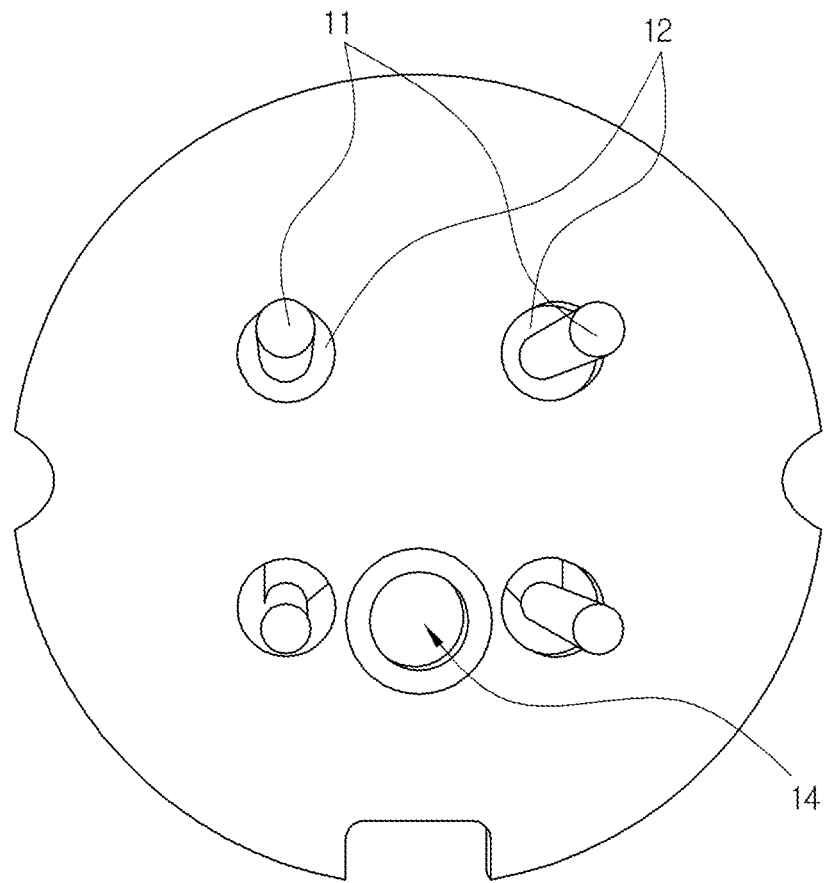
FIG. 3 is a bottom view of the high speed optical transceiver module according to preferred embodiments of the invention.

FIG. 3 is a bottom view of the high speed optical transceiver module according to some embodiments of the invention.

Prior to describing a configuration of some embodiments of the invention, matters related to the present invention will be described.

For thermal conductivity, when assuming that the thickness of an object is d [m], the area of the object is A [m$^2$] and the temperatures of both sides of the object are respectively T1 and T2 [° C.], the calorie (Q) of heat conducted to the object in a normal state for a time t [h] is proportional to the heating surface area, the difference between the temperatures and time, and is inversely proportional to the distance of the conducted heat. The calorie (Q) is given as shown in Formula (1).

$$Q=2\times A\times (T_1-T_2)/d \quad (1)$$

In the high speed optical transceiver module according to some embodiments of the invention, based on the formula, a stem 16 (FIG. 1) and a stem heat sink 15 (FIG. 1) are formed to have the increased cross sectional area to thereby increase the heat dissipation area, and heat dissipation efficiency is improved by shortening the distance where the heat generated in an LD 51 (FIG. 5) is conducted.

Further, a hole 14 (FIG. 1) with a predetermined depth is formed in the stem heat sink 15 (FIG. 1) for dissipating heat generated in the LD 51 (FIG. 5) through a lower portion of the stem 16 (FIG. 1), and a micro heater 41 (FIG. 4) is mounted in the hole, thereby achieving low power and high efficiency.

As shown in this example, the micro heater 41 (FIG. 4) is sized so that its length, width and height are 0.7 mm, 2.2 mm and 0.25 mm, respectively. However, it is understood that other sizes of micro heaters may be used without departing from the spirit of the invention.

Figure 4:
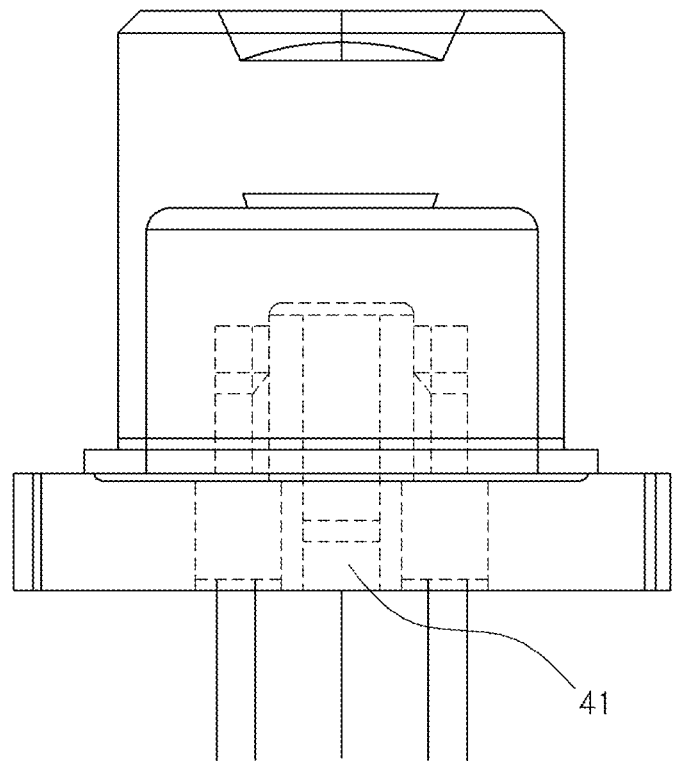
FIG. 4 shows size, length and position of a hole in the high speed optical transceiver module according to preferred embodiments of the invention.

The hole 14 (FIG. 1) is preferably formed to have a diameter sufficient to accommodate the low-power micro heater 41 (FIG. 4), so that the micro heater is fixedly mounted in the hole as shown in FIG. 4.

The low-power micro heater 41 (FIG. 4) may be mounted at one side of the stem.

The high speed optical transceiver module according to preferred embodiments of the invention performs communication using a CWDM scheme, and the interval between channels is 20 nm. 16 channels exist between wavelengths of 1270 nm to 1610 nm.

The high speed optical transceiver module according to preferred embodiments of the invention operates according to ITU-T G.692.2.

For example, there is an optical transceiver module in which a transmitter (TX) transmits light having a wavelength of 1550 nm at a room temperature (25° C.). In the module, the TX transmits light having a wavelength of 1547.5 nm (0.1 nm offset per 1° C.). That is, a wavelength shift of 0.1 nm occurs for a change of 1° C.

The allowable error of the wavelength is ±2 nm.

If the wavelength is out of the allowable error due to the lowered ambient temperature, the micro heater 41 (FIG. 4) is driven to conduct heat directly or indirectly to an LD chip so that no change in wavelength occurs. As a result, the wavelength is maintained in the same zone as that at room temperature.

Preferred embodiments of the invention utilize the second law of thermodynamics in which in case of gas, heat is conducted from an ordered state to a disordered state. That is, heat is conducted in a direction from high energy to low energy.

More specifically, in preferred embodiments of the invention, the hole 14 (FIG. 1) with the predetermined depth is formed in the stem heater sink through the lower portion of the stem 16 (FIG. 1). Thus, the cross sectional area of the stem that dissipates heat generated in the LD 51 (FIG. 5) is widened, thereby improving heat transfer efficiency. Accordingly, the stem heat sink functions as a heat dissipation plate capable of easily dissipating heat when the temperature of the LD 51 (FIG. 5) increases.

Figure 5:
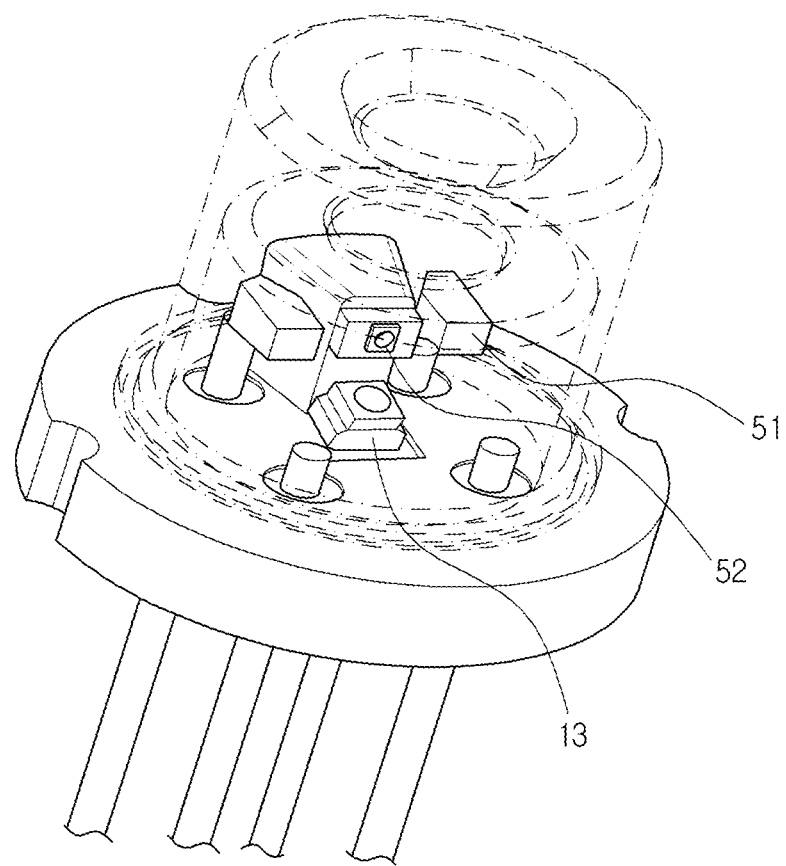
FIG. 5 is a three-dimensional view of the high speed optical transceiver module shown in FIG. 4.

In FIG. 5, a monitor photo diode (MPD) 13 (FIG. 5) monitors an output of an LD and whether or not the LD is normally operated by measuring light output from the LD, and keeps the output of the LD constant.

A hole 14 (FIG. 2) formed to have a predetermined depth in a stem heat sink 15 (FIG. 2) by a lower portion of a stem 16 (FIG. 2) does not pass through the stem heat sink 15 (FIG. 2) but is preferably formed to have the predetermined depth. The depth of the hole may be varied to increase the heat dissipation area, and the hole may pass through the heat sink as needed.

The stem 16 (FIG. 2) is attached and mounted to the heat sink 15 (FIG. 2) so as to function as a heat dissipation plate.

Preferred embodiments of the invention are configured so that all of pin leads 11 (FIG. 2) enclosed by glass or an insulator 12 (FIG. 3) are electrically isolated from the stem 16 (FIG. 2) and the stem heat sink 15 (FIG. 2), thereby reducing electrical noise in a system.

Reference number of 52 in FIG. 5 denotes a laser diode mount (LDM). That is, the high speed optical transceiver module according to preferred embodiments of the invention is designed and manufactured such that a ground of a PCB for driving the LD 51 (FIG. 5) and the lead pins are not electrically connected to each other and the ground of the PCB is floated using the stem and the stem heat sink, thereby reducing electrical noise in the system.

According to preferred embodiments of the invention, since the length of the RF transmission line formed long when the auxiliary heater is used can be reduced, it is possible to implement a high speed optical transceiver module capable of operating at a high frequency.

According to preferred embodiments of the invention, the micro heater is employed when communication using a CWDM scheme is implemented, so that it is possible to prevent interference between channels and to facilitate transmission.

Preferred embodiments of the invention have another effect in that all of the pin leads enclosed by glass or an insulator are electrically isolated from the stem and the stem heat sink thereby making reduction in electrical noise possible.

Preferred embodiments of the invention have a further effect in that it is possible to prevent a wavelength shift of light generated in the LD and thus to achieve low power and high efficiency by putting the micro heater in the hole formed in the stem heat sink through the lower portion of the stem, thereby compensating for the temperature of the LD.

Preferred embodiments of the invention have a still further effect in that since a portion of the stem heat sink is empty, the cross sectional area of the stem can be widened, heat conduction efficiency can be improved, and heat can be easily dissipated to the outside. Thus, if the temperature of the LD chip increases, heat can be easily dissipated without an additional micro heater, thereby improving light emitting efficiency and durability of the LD.

Preferred embodiments of the invention has a still further effect in that since the RF transmission line can be decreased in length as compared with an existing long RF transmission line using an auxiliary heater, it is possible to reduce the limitation of the length of the RF transmission line when the optical transceiver module is driven at a high frequency.

According to preferred embodiments of the invention, it is possible to provide a high speed optical transceiver module in which, when communication using a CWDM scheme is implemented, all of pin leads of an LD are electrically isolated from a stem and a stem heat sink, so that it is possible to prevent interference between channels in a low temperature environment and to facilitate transmission. Thus, industrial applicability is very high.

It should be understood that the embodiments and the accompanying drawings have been described for illustrative purposes, and the invention is limited only by the following claims. Further, those skilled in the art will appreciate that various modifications, additions and substitutions can be made without departing from the scope and spirit of the invention, which are limited only by the accompanying claims and equivalents thereof.

What is claimed is:

1. A high speed optical transceiver module used in communication using a coarse wavelength division multiplexing (CWDM) scheme, comprising:
   a laser diode embedded in the high speed optical transceiver module to provide light for optical communication;
   a stem heat sink electrically isolated from all of pin leads of the laser diode to reduce electrical noise and dissipate heat generated in the laser diode;
   a stem electrically isolated from all of the pin leads of the laser diode and supporting the laser diode, the stem heat sink and the leads; and
   a multi-channel optical device for CWDM,
   wherein a hole is formed in the stem heat sink from a lower portion of the stem to which the stem heat sink is fixedly mounted to efficiently dissipate the heat generated from the laser diode by widening the heat dissipation area, and wherein a micro heater with low power consumption is mounted in the hole formed in the stem heat sink to compensate for wavelength shift generated at a low temperature.

2. The high speed optical transceiver module according to claim 1, wherein all of the pin leads are electrically isolated from the stem and the stem heat sink to reduce electrical noise.

3. A high speed optical transceiver module used in communication using a coarse wavelength division multiplexing (CWDM) scheme, comprising:
   a laser diode embedded in the high speed optical transceiver module to provide light for optical communication;
   a stem heat sink electrically isolated from all of pin leads of the laser diode to reduce electrical noise and dissipate heat generated in the laser diode;
   a stem electrically isolated from all of the pin leads of the laser diode and supporting the laser diode, the stem heat sink and the leads; and
   a multi-channel optical device for CWDM,
   wherein a hole is formed in the stem heat sink from a lower portion of the stem to which the stem heat sink is fixedly mounted to efficiently dissipate the heat generated from the laser diode by widening the heat dissipation area, and wherein a radio frequency (RF) transmission line is formed short by mounting a micro heater in the hole formed in the stem heat sink to process data at a high frequency.

4. The high speed optical transceiver module according to claim 1, wherein, when the wavelength is out of an allowable error as the ambient temperature is lowered, the micro heater is driven to conduct heat directly or indirectly to the laser diode so that no change in wavelength occurs, and the wavelength is maintained in the same zone as that at room temperature.

* * * * *